United States Patent
Chen et al.

(10) Patent No.: US 7,923,770 B2
(45) Date of Patent: Apr. 12, 2011

(54) MEMORY DEVICE AND METHOD OF FABRICATING THE SAME

(75) Inventors: Chih-Lin Chen, Hsinchu (TW); Kuang-Wen Liu, Hsinchu (TW); Hsin-Huei Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 141 days.

(21) Appl. No.: 12/140,064

(22) Filed: Jun. 16, 2008

(65) Prior Publication Data

US 2009/0146266 A1    Jun. 11, 2009

(30) Foreign Application Priority Data

Dec. 11, 2007  (TW) ............................... 96147210 A (51) Int. Cl.
*H01L 29/788*    (2006.01)

(52) U.S. Cl. ..... 257/321; 257/315; 257/320; 257/E21.68
(58) Field of Classification Search .................. 257/315, 257/320, 321, E21.68
See application file for complete search history.

(56) References Cited

U.S. PATENT DOCUMENTS

2005/0145896 A1* 7/2005 Song et al. ............... 257/288
* cited by examiner

*Primary Examiner* — Tan N Tran
(74) *Attorney, Agent, or Firm* — J.C. Patents (57) ABSTRACT

A method of fabricating memory devices is provided. First, a charge storage structure including a gate dielectric structure is formed on the substrate in sequence to form a charge trapping layer. Then, a gate conductive layer is formed above the charge storage structure. Afterwards, the gate conductive layer and at least a part of the charge storage structure are patterned. The cross section of the patterned charge storage structure is then become a trapezoid or a trapezoid analogue, which has the shorter side near the gate conductive layer and the longer side near the substrate.

13 Claims, 7 Drawing Sheets

MEMORY DEVICE AND METHOD OF FABRICATING THE SAME

CROSS-REFERENCE TO RELATED APPLICATION

This application claims the priority benefit of Taiwan application serial no. 96147210, filed on Dec. 11, 2007. The entirety of the above-mentioned patent application is hereby incorporated by reference herein and made a part of this specification.

BACKGROUND OF THE INVENTION

1. Field of Invention

The present invention relates to a structure of semiconductor device and a method of fabricating the same. More particularly, the present invention relates to a structure of memory device and a method of fabricating the same.

2. Description of Related Art

The charge-trapping type memory device is a new nonvolatile memory, in which for example a silicon nitride charge trapping layer is used to replace with the traditional polysilicon floating gate of the flash memory. Because electrons will be captured by the charge trapping layer, the electrons injected to the charge trapping layer are trapped at a local area in a Gussian distribution, instead of an even distribution. Further, since the electrons are localized only at certain region of the charge trapping layer, sensitivity for tunneling oxide defection is smaller and leakage current is hardly occurred.

Figure 1:
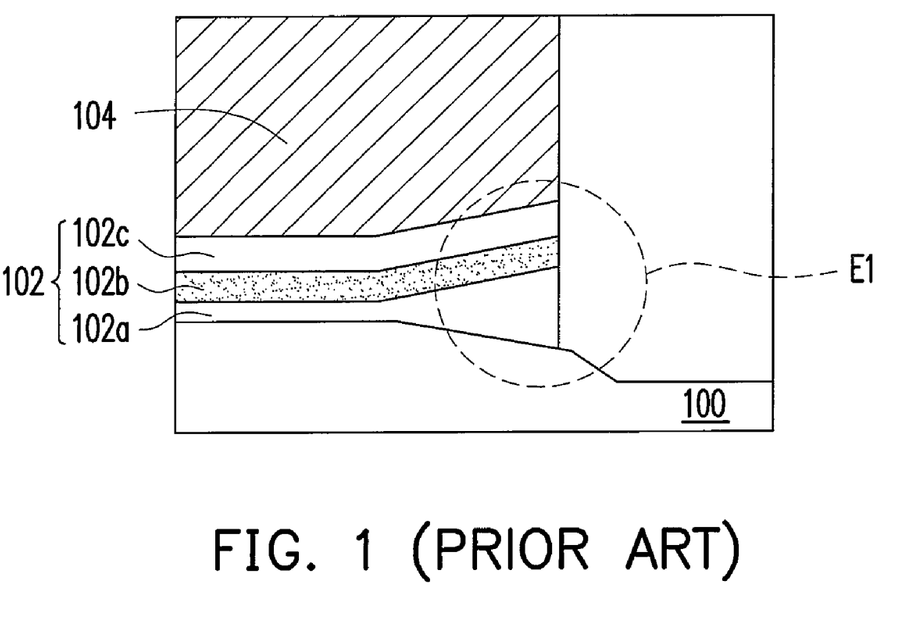
FIG. 1 is a partial enlarged view of the cross section of the conventional flash memory.

Referring to FIG. 1, a partial enlarged view of the cross section of the conventional charge-trapping type flash memory is shown. The flash memory comprises a substrate 100, a charge trapping layer 102, and a gate conductive layer 104, wherein the charge trapping layer 102 comprises a first oxide layer 102a, a nitride layer 102b, and a second oxide layer 102c. In the conventional process of fabricating the flash memory, after a bit-line etching is performed, the substrate surface may be overetched, thus leading to silicon-loss. And the silicon-loss further leads to an excess oxide encroachment as shown in the position E1 in FIG. 1 during poly re-oxidation. The enlarging of the first oxide layer 102a in the edge region obviously reduces the charge efficiency of passing the enlarging first oxide layer 102a into the nitride layer 102b, such that the edge of the nitride layer 102b used to store charges become more difficult for charges to enter the nitride layer 102b to negatively affect the device performance. Particularly, that causes the high degradation in erase efficiency after the device undergoes the endurance cycling test several times and induces the charge retention to become worse.

SUMMARY OF THE INVENTION

The present invention is to provide a method of fabricating a memory, which can reduce the oxide encroachment phenomenon in the process.

The present invention is to provide a structure of memory. The width of the cross section of the charge trapping layer of the charge storage structure is larger than that of the gate conductive layer, which can reduce the area covered by the oxide encroaching into the gate dielectric structure.

The present invention provides a method of fabricating the memory. First, a charge storage structure including a gate dielectric structure is formed on the substrate. Then, a gate conductive layer is formed above the charge storage structure. Thereafter, the gate conductive layer and at least a part of the charge storage structure are patterned, such that the cross section of the patterned charge storage structure becomes approximately a trapezoid or a trapezoid analogue with the shorter side near the gate conductive layer and the longer side near the substrate.

According to an embodiment of the present invention, the above-mentioned process of patterning the gate conductive layer and at least a part of the charge storage structure comprises a dry etching process.

According to an embodiment of the present invention, the charge storage structure includes a charge trapping layer on the gate dielectric structure.

According to an embodiment of the present invention, the gate dielectric structure includes a first oxide layer and the charge trapping layer includes a nitride layer.

According to an embodiment of the present invention, the charge storage structure further comprises a second oxide layer between the gate conductive layer and the charge trapping layer.

According to an embodiment of the present invention, the above-mentioned process of patterning the gate conductive layer and at least a part of the charge storage structure comprises patterning the gate dielectric structure, the charge trapping layer, and the second oxide layer with the substrate surface as the etch stop layer.

According to an embodiment of the present invention, the above-mentioned process of patterning the gate conductive layer and at least a part of the charge storage structure comprises patterning the second oxide layer and the charge trapping layer with the surface of the gate dielectric structure as the etch stop layer.

According to an embodiment of the present invention, the above-mentioned process of patterning the gate conductive layer with the gate dielectric structure as the etch stop layer.

According to an embodiment of the present invention, after performing the above-mentioned process of forming the gate conductive layer and before performing the process of patterning the gate conductive layer and at least a part of the charge storage structure, a cap layer and a photoresist layer are further formed on the gate conductive layer in sequence, and after performing the process of patterning the gate conductive layer and at least a part of the charge storage structure, the photoresist layer is further removed.

The present invention provides a method of fabricating the memory. First, charge storage structure including a gate dielectric structure is formed on the substrate. Then, a gate conductive layer and a cap layer are formed above the charge storage structure in sequence. Next, a patterning process is performed on the cap layer, the gate conductive layer, and at least a part of the charge storage structure. Thereafter, an oxidation process is performed on the charge storage structure not covered by the gate conductive layer to form a third oxide layer and to form a silicon oxide liner on an exposed surface of the cap layer and the gate conductive layer.

According to an embodiment of the present invention, the charge storage structure includes a charge trapping layer on the gate dielectric structure.

According to an embodiment of the present invention, the gate dielectric structure includes a first oxide layer and the charge trapping layer includes a nitride layer.

According to an embodiment of the present invention, the gate charge storage structure further comprises a second oxide layer between the gate conductive layer and the charge trapping layer.

According to an embodiment of the present invention, after patterning the cap layer, the gate conductive layer, and at least a part of the charge storage structure and before performing the oxidation process, a wet etching process is performed to remove the second oxide layer not covered by the gate conductive layer.

According to an embodiment of the present invention, the wet etching process comprises hydrofluoric acid solution.

According to an embodiment of the present invention, the oxidation process comprises a wet thermal oxidation process.

According to an embodiment of the present invention, after performing the oxidation process, the cross section of the charge storage structure becomes a trapezoid or a trapezoid analogue with the shorter side near the gate conductive layer and the longer side near the substrate.

According to an embodiment of the present invention, the process of patterning the cap layer, the gate conductive layer, and at least a part of the charge storage structure includes a dry etching process.

The present invention provides a method of fabricating memory. First, a charge storage structure including a gate dielectric structure is formed on the substrate. Then, a gate conductive layer and a cap layer are formed above the charge storage structure in sequence. Thereafter, the cap layer and the gate conductive layer are patterned, and a spacer is formed on the side walls of the cap layer and the gate conductive layer. Next, the etching process is performed with the cap layer and the spacer as a mask, so as to remove the charge storage structure not covered by the cap layer and the spacer.

According to an embodiment of the present invention, the charge storage structure includes a charge trapping layer on the gate dielectric structure.

According to an embodiment of the present invention, the gate dielectric structure includes a first oxide layer and the charge trapping layer includes a nitride layer.

According to an embodiment of the present invention, the gate dielectric structure further includes a second oxide layer between the gate conductive layer and the charge trapping layer and the etching process further includes removing the second oxide layer not covered by the cap layer and the spacer.

The present invention provides a structure of memory, which comprises a substrate, a gate conductive layer and a charge storage structure. The cross section of at least a part of the charge storage structure is a trapezoid or a trapezoid analogue with the shorter side near the gate conductive layer and the longer side near the substrate.

According to an embodiment of the present invention, the charge storage structure includes a charge trapping layer, and the part of the charge storage structure has the trapezoid or the trapezoid analogue cross section is the charge trapping layer.

According to an embodiment of the present invention, the charge storage structure includes a gate dielectric structure and a charge trapping layer from bottom to top, and the part of the charge storage structure having the trapezoid or the trapezoid analogue cross section is the gate dielectric structure and the charge trapping layer, or the charge trapping layer.

According to an embodiment of the present invention, the charge storage structure includes a gate dielectric structure, a charge trapping layer and a second oxide layer from bottom to top, and the part of the charge storage structure having the trapezoid or the trapezoid analogue cross section is the gate dielectric structure, the charge trapping layer and the second oxide layer, or the gate dielectric structure and the charge trapping layer, or the charge trapping layer.

According to an embodiment of the present invention, the gate dielectric structure includes a first oxide layer, and the charge trapping layer includes a nitride layer.

The present invention provides a structure of memory, which comprises a substrate, a charge storage structure, a gate conductive layer, and a spacer. The charge storage structure includes gate dielectric structure, a charge trapping layer, and a second oxide layer on the substrate in sequence. The gate conductive layer is disposed above the second oxide layer. The spacer is disposed on the side wall of the gate conductive layer and covers a part of the second oxide layer. The width of the second oxide layer and the charge trapping layer being approximately the same as the distance between the outer sides of the spacer.

According to an embodiment of the present invention, the gate dielectric structure includes a first oxide layer, and the charge trapping layer includes a nitride layer.

The etching process in the present invention ends at the surface of the substrate, the surface of the gate dielectric structure, or the surface of the second oxide layer, thus avoiding the conventional silicon-loss phenomenon and eliminating problems such as oxide encroachment. Therefore, data retention capability can be improved and the integrity of the charge storage structure can be maintained.

In order to the make aforementioned and other objects, features and advantages of the present invention comprehensible, a preferred embodiment accompanied with figures are described in detail below.

DESCRIPTION OF EMBODIMENTS

The First Embodiment

Figure 2A:
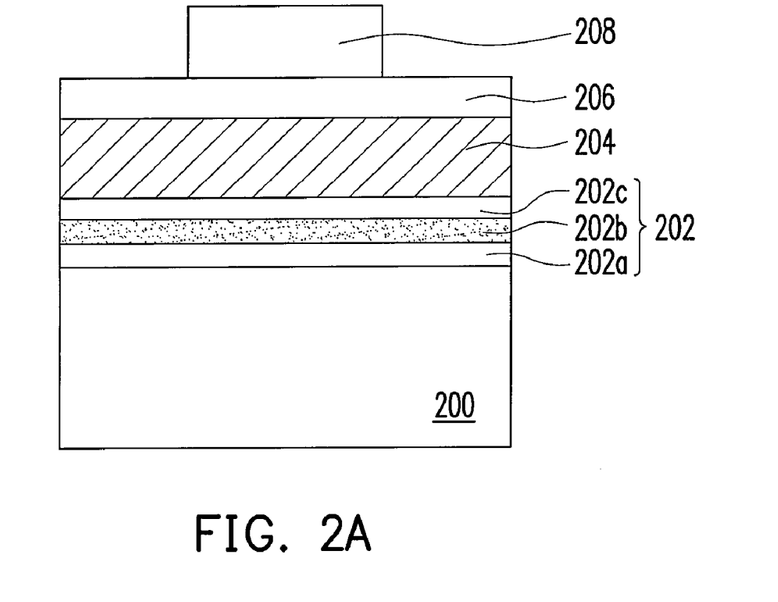
FIGS. 2A to 2B are sectional views of a part of the processes of fabricating the memory device according to an embodiment of the present invention.
Figure 2B:
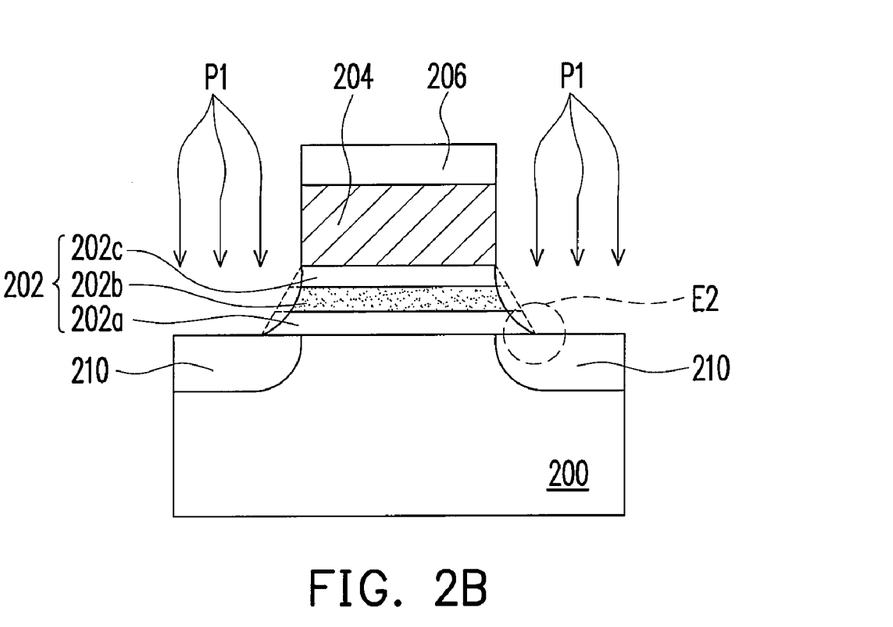

FIGS. 2A to 2B are sectional views of a part of the processes of fabricating the memory device in this embodiment.

Referring to FIG. 2A, first, a charge storage structure 202 is formed on a substrate 200. Then, a gate conductive layer 204 and a cap layer 206 are formed on the charge storage structure 202 in sequence. After that, a photoresist layer 208 is formed above the cap layer 206.

In an embodiment, the material of the substrate 200 is, for example, a bulk substrate. In another embodiment, the material of the substrate 200 can be a Silicon On Insulator (SOI) substrate. The charge storage structure 202 can be formed by the dual-layer structure of a gate dielectric structure 202a and a charge trapping layer 202b. The gate dielectric structure 202a includes a first oxide layer such as a silicon oxide layer. The charge trapping layer 202b is constitute of a high dielectric constant dielectric material including nitride such as silicon nitride. In another embodiment, the charge storage structure 202 also can be formed by the triple-layer structure of the gate dielectric structure 202a, the charge trapping layer 202b, and the second oxide layer 202c. The second oxide layer 202c is silicon oxide layer, for example. In this embodiment, the triple-layer structure is taken for illustration. The materials of the gate dielectric structure 202a and the second oxide layer 202c can be the same or different. The commonly used material is silicon oxide. The material of the gate conductive layer 204 is, for example, doped polysilicon. The material of the cap layer 206 is, for example, silicon nitride.

Then, referring to FIG. 2B, an etching process P1 is performed with the photoresist layer 208 serving as a mask and the surface of the substrate 200 serving as the etch stop layer to remove a part of the cap layer 206, the gate conductive layer 204, and the charge storage structure 202. In this embodiment, the removed part of the charge storage structure 202 is the gate dielectric structure 202a, the charge trapping layer 202b, and the second oxide layer 202c.

After the etching process P1, the photoresist layer 208 is removed. After that, a source and drain 210 is formed in the substrate 200 at the outer sides of the gate conductive layer 204, and a pocket implanting process is performed.

The etching process P1 can be a dry etching process, for example, with a compound partly substituted by fluorine such as $CHF_3$ and perfluorinated compound such as $CF_4$ serving as etching gas, a pressure of 4 to 100 millitorrs, a source power of about 100 to 500 watts, and a bias power of about 0 to 100 watts. The etching time varies depending on different thickness. In addition, the conditions of the process may also be different depending on different machine table. This process does not excessively remove the surface of the substrate 200 and the cross section of the patterned charge storage structure 202 become proximately a trapezoid or a trapezoid analogue with a narrow upper side and a wide lower side, that is, the part near the gate conductive layer 204 is the shorter side of the trapezoid, and the part near the substrate 200 is the longer side of the trapezoid or the trapezoid analogue. The below description is illustrated with the trapezoid for convenience. The width of the shorter side of the trapezoid is approximately the same as that of the gate conductive layer 204. The widths of the gate dielectric structure 202a and the charge trapping layer 202b thereabove which is mainly used for storing charges is slightly larger than the width of the gate conductive layer 204. The length ratio of the shorter side to the longer side is no more than 0.9, preferably, no more than 0.8. In addition, the two nonparallel sides of the trapezoid can be straight lines, curves or irregular lines. In the drawing, a solid line indicates that the two nonparallel sides of the trapezoid are curves, and a dash line indicates that the two nonparallel sides of the trapezoid are straight lines.

As shown in FIG. 1, conventionally, since the width of the cross section of the charge storage structure 102 is the same as the width of the gate conductive layer 104, and the substrate 100 may be overetched, an obvious oxide encroachment phenomenon may easily occur at the edge of the charge storage structure 102, resulting in that the volume of gate dielectric structure 102a becomes thicker and the device performance is further affected. In this embodiment, as the substrate 200 is not overetched and the cross section of the patterned charge storage structure 202 becomes approximately a trapezoid with the above-mentioned shape, such that the edge of the cross section of the charge storage structure in which an oxide encroachment may occur is located outside the region covered by the gate conductive layer as shown in E2 of FIG. 2B. Thus, the probability of the occurrence of the oxide encroachment to the gate dielectric structure covered by the gate conductive layer is greatly reduced, and the probability of influencing the charge storing capability of memory is accordingly reduced, thereby improving the memory performance.

The Second Embodiment

Figure 3A:
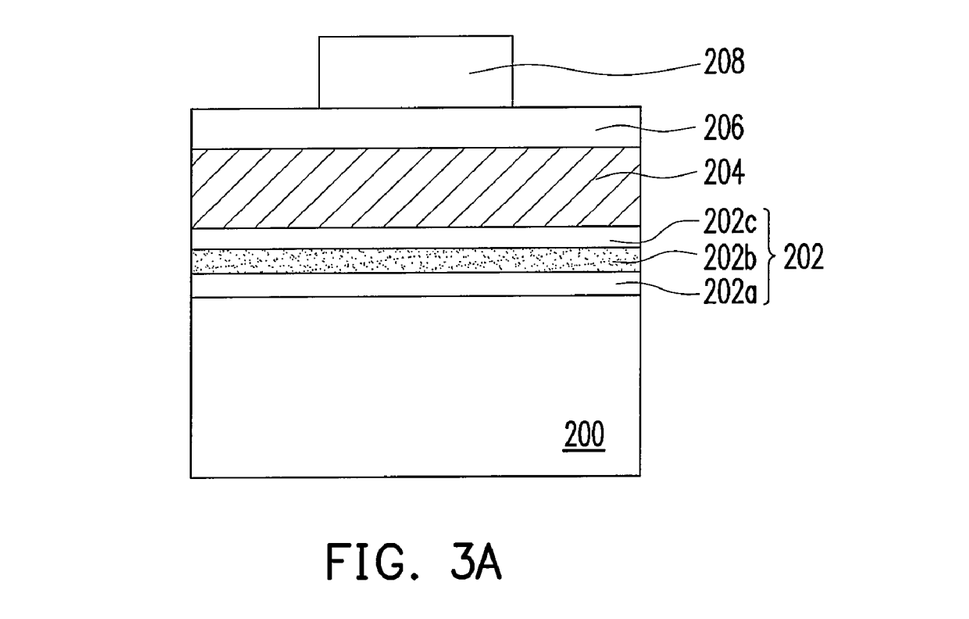
FIGS. 3A to 3B are sectional views of a part of the processes of fabricating the memory device according to another embodiment of the present invention.
Figure 3B:
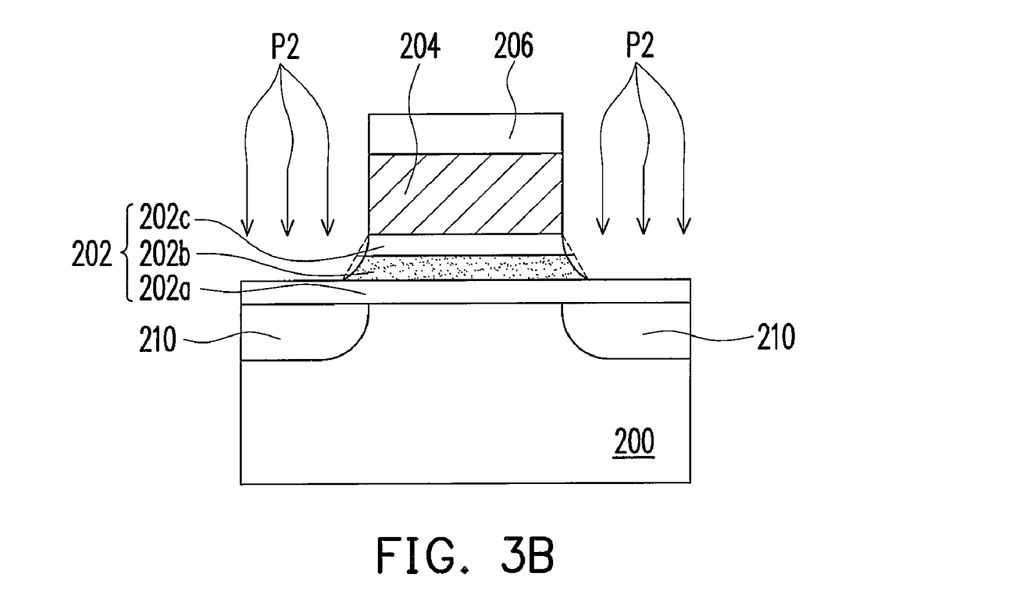

FIGS. 3A to 3B are sectional views of a part of processes of fabricating the memory device according to the second embodiment of the present invention.

Referring to FIGS. 3A to 3B, the second embodiment of the present invention is similar to the first embodiment, but the etching process P1 of the first embodiment is changed to be an etching process P2 in the second embodiment. The etching process P1 of the first embodiment uses the substrate 200 as the etch stop layer, and the second embodiment of the present invention uses the gate dielectric structure 202a as the etch stop layer instead.

Referring to FIG. 3A, first, a charge storage structure 202 is formed on the substrate 200. The charge storage structure 202 comprises a gate dielectric structure 202a, a charge trapping layer 202b, and a second oxide layer 202c. Then, a gate conductive layer 204 and a cap layer 206 are formed on the charge storage structure 202 in sequence. Thereafter, a photoresist layer 208 is formed above the cap layer 206. The material of the above-mentioned layers and the forming method can employ those described in the first embodiment.

Referring to FIG. 3B, an etching process P2 is performed with the gate dielectric structure 202a serving as the etch stop layer to pattern the cap layer 206, the gate conductive layer 204, the charge trapping layer 202b, and the second oxide layer 202c, such that the cross sections of the patterned charge trapping layer 202b and the second oxide layer 202c become approximately a trapezoid or a trapezoid analogue with the shorter side near the gate conductive layer 204 and the longer side near the substrate 200, in which the two nonparallel sides of the trapezoid or a trapezoid analogue may be straight lines, curves or irregular lines. In the drawing, the solid line indicates that two nonparallel sides of the trapezoid are curves, and the dashed line indicates that the two nonparallel sides of the trapezoid or the trapezoid analogue are straight lines. After the etching process P2, the photoresist layer 208 is removed. After that, a source and drain 210 is formed in the substrate 200 at the outer sides of the gate conductive layer 204, and a pocket implanting process is performed.

The etching process P2 can employ the process described in the first embodiment, but uses the gate dielectric structure 202a as the etch stop layer. Since the gate dielectric structure 202a is not removed in the etching process, the silicon-loss phenomenon existing in the conventional art cannot easily occur in this embodiment, and the probability of the occurrence of the subsequent oxide encroachment phenomenon can be reduced. Also, since the cross sections of the patterned charge trapping layer 202b and the second oxide layer 202c become a trapezoid, and the width of the charge trapping layer 202b is slightly larger than that of the gate conductive layer 204, such that the edge of the cross section of the charge storage structure in which an oxide encroachment may occur is located outside the region covered by the gate conductive layer. Thus, despite the occurrence of the oxide encroachment, the influence to the memory performance can be greatly reduced. The conventional problem that the volume of the first oxide layer is compressed and becomes smaller can be improved by the process and the memory structure of this embodiment.

The Third Embodiment

Figure 4A:
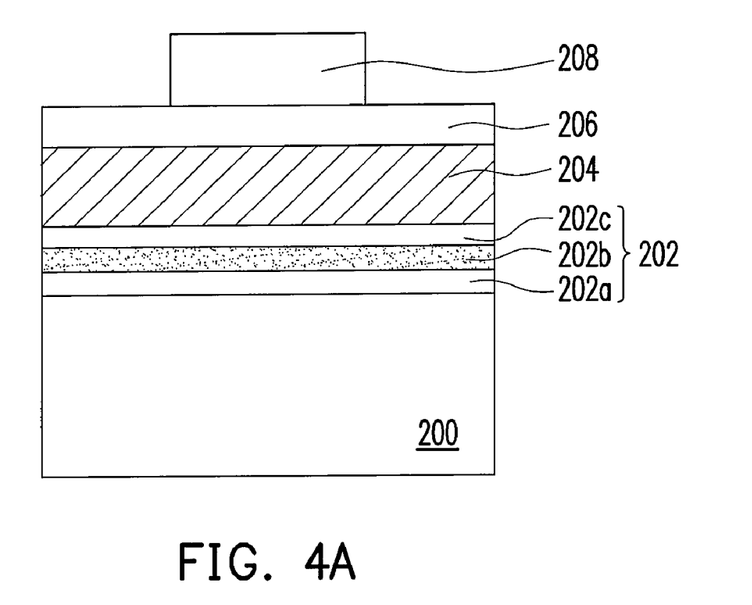
FIGS. 4A to 4C are sectional views of a part of the processes of fabricating the memory device according to still another embodiment of the present invention.
Figure 4B:
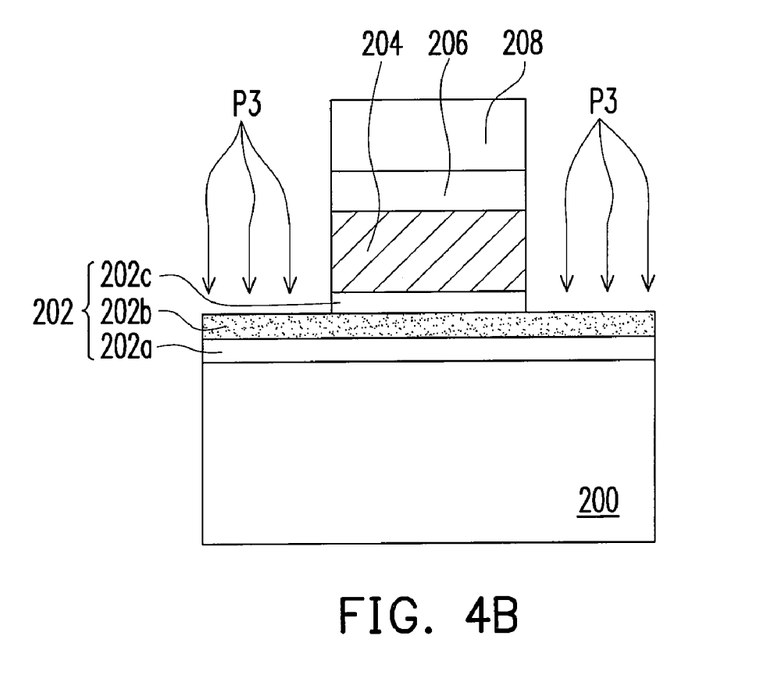
Figure 4C:
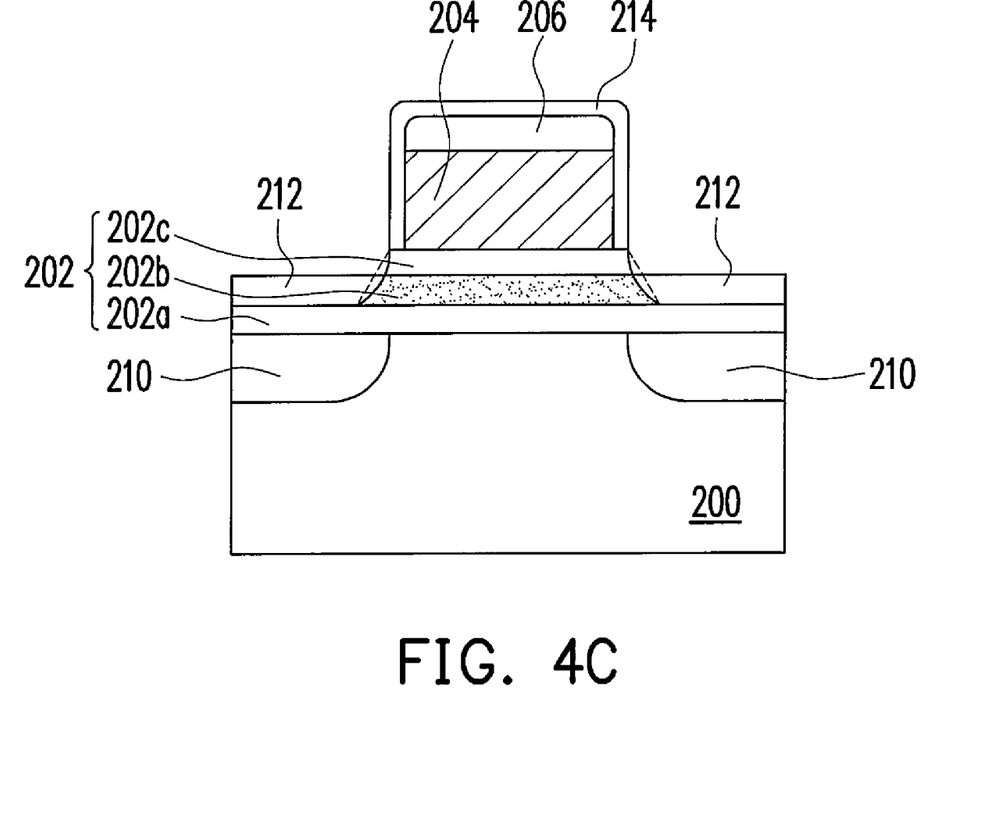

FIGS. 4A to 4C are sectional views of a part of the processes of fabricating the memory device according to the third embodiment of the present invention.

Referring to FIG. 4A, first, a charge storage structure 202 is formed on the substrate 200. The charge storage structure 202 comprises a gate dielectric structure 202a, a charge trapping layer 202b, and a second oxide layer 202c. Then, a gate conductive layer 204 and a cap layer 206 are formed on the second oxide layer 202c in sequence. Thereafter, a photoresist layer 208 is formed above the cap layer 206. This part of processes can be accomplished by using the same method described in the first embodiment.

Referring to FIG. 4B, a patterning process is performed on the cap layer 206 and the gate conductive layer 204 by using the photoresist layer 208 as a mask. For example, hydrogen bromide, helium, mixed gas of helium and oxygen, and oxygen can be used as etching gas. In an embodiment, hydrogen bromide with a flow of 50-300 sccm, helium with a flow of 0-200 sccm, mixed gas of helium and oxygen with a flow of 0-200 sccm, and oxygen with a flow of 0-50 sccm are used as the etching gas. The pressure is controlled between 4 and 100 millitorrs. The source power is controlled at about 100 to 500 watts. The bias power is controlled at about 0 to 100 watts. The etching time varies depending on different thickness. In addition, the conditions of process may also be different depending on different machine table. Then, a wet etching process P3 is performed with, for example, the hydrofluoric acid solution serving as etchant, and the charge trapping layer 202b serving as the etch stop layer to remove the second oxide layer 202c not covered by the photoresist layer.

After that, referring to FIG. 4C, the photoresist layer 208 is removed. Then, an oxidation process is performed to oxidize the charge trapping layer 202b not covered by the second oxide layer 202c to form a third oxide layer 212 and to form a silicon oxide liner 214 on the exposed surface of the cap layer 206 and the gate conductive layer 204. After that, a source and drain 210 is formed in the substrate 200 at the outer sides of the gate conductive layer 204, and a pocket implanting process is performed.

The oxidation process for forming the third oxide layer 212 comprises a wet thermal oxidation process. For example, the device is heated in an environment containing aqueous vapor. After the oxidation process is performed, the cross section of the silicon nitride layer 202b becomes a trapezoid with the shorter side near the gate conductive layer 204 and the longer side near the substrate 200, in which the two nonparallel sides of the trapezoid can be straight lines or curves. In the drawing, the solid line indicates that the two nonparallel sides of the trapezoid are curves, and the dashed line indicates that the two nonparallel sides of the trapezoid are straight lines. As mentioned in the above embodiment, such a device structure can employ the charge storage layer with the trapezoid cross section and selectively etch a part of the charge storage structure to avoid the oxide encroachment problem existing in the conventional art and improve the memory performance.

The Fourth Embodiment

Figure 5A:
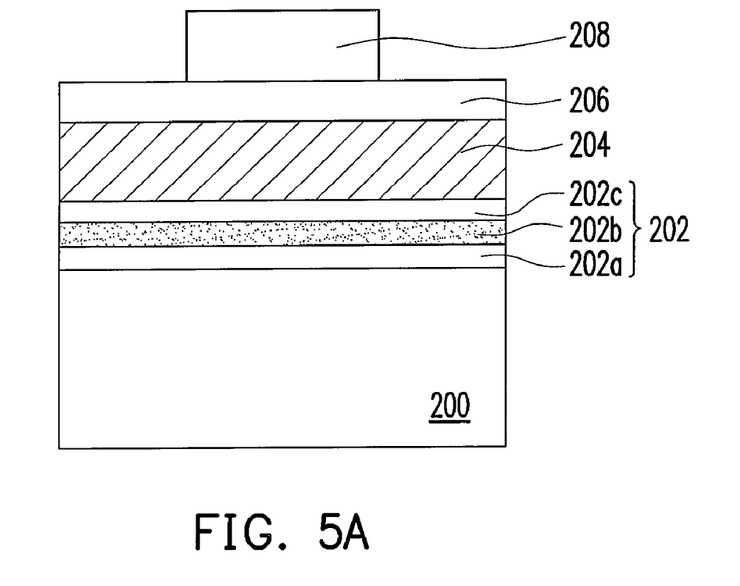
FIGS. 5A to 5C are sectional views of a part of the processes of fabricating the memory device according to yet another embodiment of the present invention.
Figure 5B:
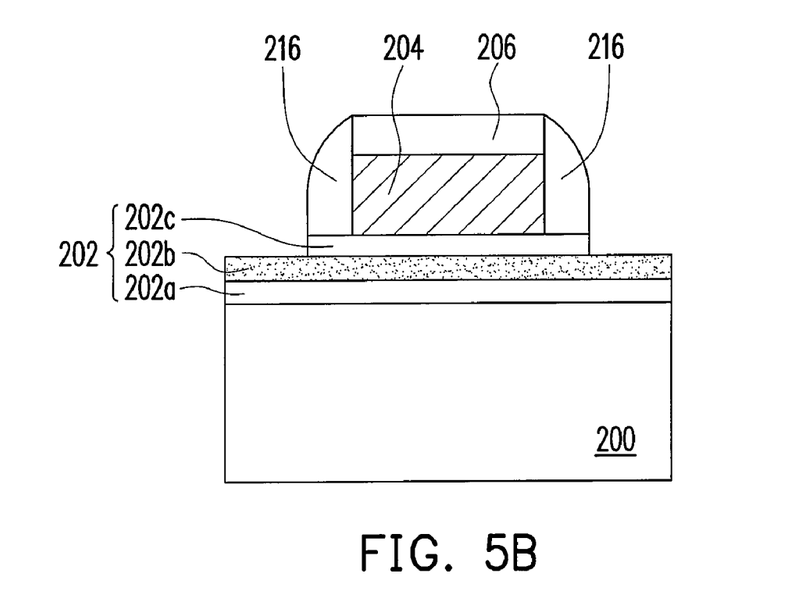
Figure 5C:
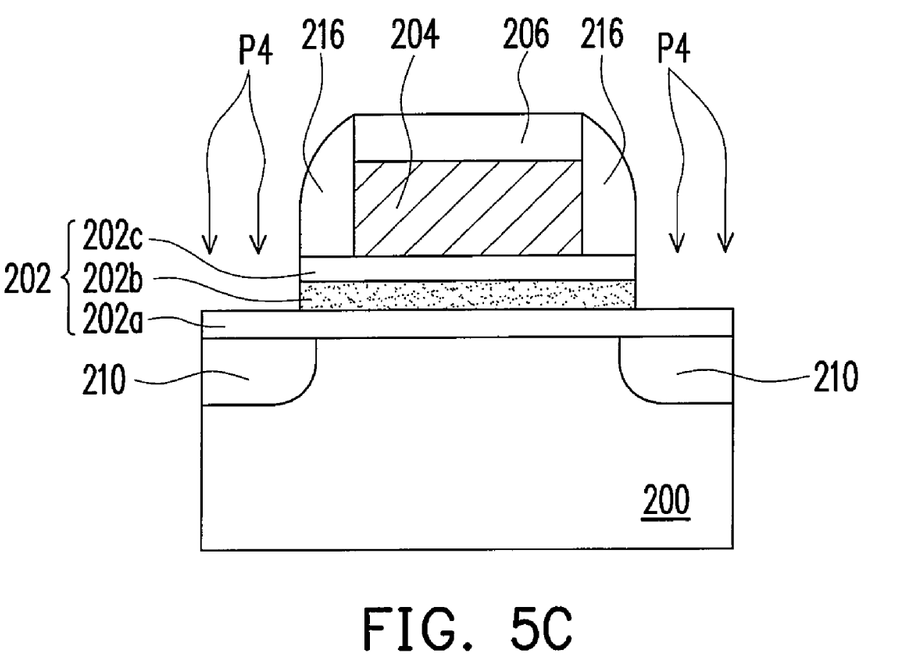

FIGS. 5A to 5C are sectional views of a part of the processes of fabricating the memory device according to the fourth embodiment of the present invention.

Referring to FIG. 5A, first, a charge storage structure 202 is formed on the substrate 200. The charge storage structure 202 comprises a gate dielectric structure 202a, a charge trapping layer 202b, and a second oxide layer 202c. Then, a gate conductive layer 204 and a cap layer 206 are formed on the second oxide layer 202c in sequence. Thereafter, a photoresist layer 208 is formed above the cap layer 206. This part of process can be accomplished by using the same method described in the first embodiment.

Next, referring to FIG. 5B, the cap layer 206 and the gate conductive layer 204 are patterned with the photoresist layer 208 as a mask. Then, the photoresist layer 208 is removed. Then, a spacer 216 is formed at the sidewalls of the gate conductive layer 204 and the cap layer 206. The material of the spacer 216 is, for example, silicon oxide, and the forming method is, for example, the chemical vapor deposition (CVD) to deposit silicon oxide on the device surface, and a dry etching process is used to remove the excess silicon oxide with the charge trapping layer 202b as an etching stop layer.

After that, referring to FIG. 5C, the cap layer 206 and the spacer 216 are used as a mask, and an etching process P4 is performed to remove the second oxide layer 202c and the charge trapping layer 202b not covered by the cap layer 206 and the spacer 216. The etching process P4 can be a dry etching process. Then, a source and drain 210 is formed in the substrate 200 at two sides of the gate conductive layer 204, and a pocket implanting process is performed.

In this embodiment, as the process of spacer is used, the width of the cross section of the charge storage structure is larger than the width of the gate conductive layer. Therefore, the probability of the occurrence of the oxide encroachment phenomenon existing in the conventional art at the edge of the charge storage structure can be reduced and the probability of the degradation in the memory performance can also be reduced since the nitride layer is wider than the gate conductive layer in this embodiment. The improvement of device performance can be accomplished as that of the aforementioned embodiment.

In view of the above, since through the etching process employed in the present invention, the substrate cannot be overetched, the probability of the occurrence of the silicon-loss and the subsequent oxide encroachment existing in the conventional art can be reduced. In addition, the cross section of the charge storage structure is formed to be a trapezoid with a narrow upper side and a wide lower side, or the process of spacer is used to make the nitride layer for storing charges to be wider than the gate conductive layer, which can reduce the influence to memory performance to the minimum when the oxide encroachment occurs at the edge of the cross section of the charge storage structure. Therefore, the present invention can enhance the data storing capability of memory and improve the memory performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a memory device, comprising:
    forming a charge storage structure including a gate dielectric structure, a charge trapping layer and a second oxide layer from bottom to top;
    forming a gate conductive layer above the charge storage structure; and
    patterning the gate conductive layer and at least a part of the charge storage structure, such that the cross section of a patterned charge storage structure including a patterned gate dielectric structure, a patterned charge trapping layer and a patterned second oxide layer becomes approximately a trapezoid or a trapezoid analogue with the shorter side near the gate conductive layer and the longer side near the substrate; and
    during an oxidation process, an oxide encroachment is formed located at a region between the longer side of the charge storage structure and the substrate and not covered by the gate conductive layer but not extend under the gate conductive layer.

2. The method of fabricating the memory device as claimed in claim 1, wherein the process of patterning the gate conductive layer and at least a part of the charge storage structure is a dry etching process.

3. The method of fabricating the memory device as claimed in claim 1, wherein the charge storage structure includes a charge trapping layer on the gate dielectric structure.

4. The method of fabricating the memory device as claimed in claim 3, wherein the gate dielectric structure includes a first oxide layer and the charge trapping layer includes a nitride layer.

5. The method of fabricating the memory device as claimed in claim 3, wherein the charge storage structure further comprises a second oxide layer between the gate conductive layer and the charge trapping layer.

6. The method of fabricating the memory device as claimed in claim 5, wherein the process of patterning the gate conductive layer and at least a part of the charge storage structure comprises patterning the gate dielectric structure, the charge trapping layer, and the second oxide layer with the substrate surface as an etch stop layer.

7. The method of fabricating the memory device as claimed in claim 5, wherein the process of patterning the gate conductive layer and at least a part of the charge storage structure comprises patterning the second oxide layer and the charge trapping layer with the gate dielectric structure as the etch stop layer.

8. The method of fabricating the memory device as claimed in claim 1, wherein the process of patterning the gate conductive layer and at least a part of the charge storage structure comprises patterning the charge storage structure with the gate dielectric structure as the etch stop layer.

9. The method of fabricating the memory device as claimed in claim 1, after forming the gate conductive layer and before performing the process of patterning the gate conductive layer and at least a part of the charge storage structure, further comprising forming a cap layer and a photoresist layer on the gate conductive layer in sequence; and after performing the process of patterning the gate conductive layer and at least a part of the charge storage structure, further comprising removing the photoresist layer.

10. A memory device, comprising:
a substrate;
a gate conductive layer, disposed on the substrate;
a charge storage structure, comprising a gate dielectric structure, a charge trapping layer and a second oxide layer from bottom to top, the cross section of the gate dielectric structure, the charge trapping layer and the second oxide layer of the charge storage structure becoming approximately a trapezoid or a trapezoid analogue with the longer side near the substrate and the shorter side near the gate conductive layer; and
an oxide encroachment located at a region between the longer side of the charge storage structure and the substrate and not covered by the gate conductive layer,
wherein the longer side of the trapezoid or the trapezoid analogue has enough length besides the gate conductive layer to avoid the oxide encroachment extending under the gate conductive layer.

11. The memory device as claimed in claim 10, wherein the charge storage structure includes a charge trapping layer, and the part of the charge storage structure has the trapezoid or the trapezoid analogue cross section is the charge trapping layer.

12. The memory device as claimed in claim 10, wherein the charge storage structure includes a gate dielectric structure and a charge trapping layer from bottom to top, and the part of the charge storage structure having the trapezoid or the trapezoid analogue cross section is the gate dielectric structure and the charge trapping layer, or the charge trapping layer.

13. The memory device as claimed in claim 10, wherein the gate dielectric structure includes a first oxide layer, and the charge trapping layer includes a nitride layer.

* * * * *